US011923830B2

(12) United States Patent
Liu et al.

(10) Patent No.: US 11,923,830 B2
(45) Date of Patent: Mar. 5, 2024

(54) TUNABLE FILTER (71) Applicant: Huawei Technologies Co., Ltd., Shenzhen (CN)

(72) Inventors: Xiaoguang Liu, Davis, CA (US); Yuehui Ouyang, Sunnyvale, CA (US); Xudong He, Cupertino, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 779 days.

(21) Appl. No.: 17/016,846

(22) Filed: Sep. 10, 2020

(65) Prior Publication Data
US 2020/0412337 A1 Dec. 31, 2020

Related U.S. Application Data (63) Continuation of application No. PCT/CN2019/076830, filed on Mar. 4, 2019.

(60) Provisional application No. 62/645,489, filed on Mar. 20, 2018.

(51) Int. Cl.
H03H 9/70 (2006.01)
H03H 9/72 (2006.01)
H04B 1/18 (2006.01)

(52) U.S. Cl.
CPC .............. *H03H 9/703* (2013.01); *H03H 9/72* (2013.01); *H04B 1/18* (2013.01)

(58) Field of Classification Search
CPC . H03H 9/703; H03H 9/72; H04B 1/18; H04B 1/123
USPC .......................................................... 333/133
See application file for complete search history.

(56) References Cited

U.S. PATENT DOCUMENTS

| 7,400,217 | B2 | 7/2008 | Larson, III et al. |
| 8,310,321 | B2 | 11/2012 | Kadota |
| 8,410,871 | B2 | 4/2013 | Kim et al. |
| 9,559,659 | B2 | 1/2017 | Bojer |
| 9,705,542 | B2 | 7/2017 | Leipold et al. |
| 9,748,916 | B2 | 8/2017 | Bojer et al. |

(Continued)

FOREIGN PATENT DOCUMENTS

| CN | 101116253 A | 1/2008 |
| CN | 107634766 A | 1/2018 |

(Continued)

OTHER PUBLICATIONS

Anonymous, Modules for Software Defined Radio-The Proactive Development of Software Defined Radio Modules That Facilitate Adaptation to Future Communication Methods retrieved from:https://corporate.murata.com/en-global/about/newsroom/techmag/metamorphosis20/productsmarket/software on Jul. 23, 2020,total 3 pages.

(Continued)

*Primary Examiner* — Rakesh B Patel
*Assistant Examiner* — Jorge L Salazar, Jr.
(74) *Attorney, Agent, or Firm* — Vierra Magen Marcus LLP (57) ABSTRACT A tunable filter with wide tuning range and high out-of-band rejection is achieved with a tunable bandpass filter and a number of cascaded, fixed frequency Lame-Mode Resonators (LMRs) notch filters or other resonators. In some embodiments, the filter can be implemented with all of the elements on an integrated circuit, saving space for use in applications such as mobile phones or other mobile communication devices.

23 Claims, 8 Drawing Sheets

(56) References Cited

U.S. PATENT DOCUMENTS

| | | | |
|---|---|---|---|
| 9,755,614 B2 | 9/2017 | Kadota | |
| 2004/0113719 A1* | 6/2004 | Nakai | H01L 23/49805 |
| | | | 257/E23.114 |
| 2006/0135195 A1* | 6/2006 | Leinonen | H04B 1/0057 |
| | | | 455/78 |
| 2008/0252178 A1* | 10/2008 | Yamada | H03H 9/02023 |
| | | | 310/366 |
| 2015/0235971 A1 | 8/2015 | Smith et al. | |
| 2016/0204755 A1* | 7/2016 | Kando | H03H 9/6483 |
| | | | 333/175 |
| 2016/0352308 A1* | 12/2016 | Ivira | H03H 9/173 |
| 2017/0063412 A1 | 3/2017 | Ripley et al. | |

FOREIGN PATENT DOCUMENTS

| | | |
|---|---|---|
| IN | 106026949 A | 10/2016 |
| WO | 2017073652 A1 | 5/2017 |
| WO | 2017149878 A1 | 9/2017 |

OTHER PUBLICATIONS

Tao Yang et al., "Bandpass-to-Bandstop Reconfigurable Tunable Filters with Frequency and Bandwidth Controls",IEEE Transactions On Microwave Theory and Techniques, vol. 65, No. 7, Jul. 2017,total 10 pages.

International Search Report dated May 24, 2019, International Application No. PCT/CN2019/076830.

Chinese Office Action dated Feb. 23, 2021, Application No. 201980019227.1.

\* cited by examiner

TUNABLE FILTER

CLAIM OF PRIORITY

This application is a continuation of PCT Patent Application No. PCT/CN2019/076830, entitled, "Tunable Filter," filed Mar. 4, 2019 by Liu et al., which claims priority to U.S. Provisional Patent Application No. 62/645,489, entitled, "Tunable Filter," filed Mar. 20, 2018 by Liu et al., both of which are incorporated by reference herein in their entirety.

FIELD

The following is related to tunable filter design.

BACKGROUND

With the rapid development of wireless communication standards, mobile phones and other wireless communication devices are required to support multiple bands, Multi-input, Multi-output (MIMO) and other such arrangements that involve large numbers of frequency bands. More and more filters are needed in mobile phone systems to meet performance requirements of wireless communication standards. As a result, the size and cost of filters used in mobile phone systems has become a concern.

SUMMARY

According to one aspect of the present disclosure, there is provided an apparatus having an input port, an output port and a tunable bandpass filter connected between the input port and the output port that is configured to provide out-of-band rejection about a tunable frequency center. A plurality of fixed frequency filters, each of a different corresponding fixed frequency, are connected in parallel between ground and a line connecting the tunable bandpass filter to the input port and/or the output port and configured to provide high rejection at the corresponding fixed frequency. Each of the fixed frequency filters are selectively connectable to the line connecting the tunable bandpass filter to the input port and/or the output port by a corresponding one of a plurality of switches.

Optionally, in the preceding aspect, another implementation of the aspect provides that the fixed frequency filters are comprised of Lame-mode resonators.

Optionally, in any of the preceding aspects, another implementation of the aspect provides that the fixed frequency filters are comprised of thin film bulk acoustic resonators.

Optionally, in any of the preceding aspects, another implementation of the aspect provides that the fixed frequency filters are comprised of surface acoustic wave resonators.

Optionally, in any of the preceding aspects, another implementation of the aspect provides that the tunable bandpass filter includes a MEMS (Micro-Electro-Mechanical System) based capacitor.

Optionally, in any of the preceding aspects, another implementation of the aspect provides that the MEMS based capacitor, the fixed frequency filters, and the switches are all formed on a common integrated circuit.

Optionally, in any of the preceding aspects, another implementation of the aspect provides that the tunable bandpass filter further includes an inductor formed on the common integrated circuit.

Optionally, in any of preceding aspects, another implementation of the aspect provides that the tunable bandpass filter further includes an inductor not formed on the common integrated circuit.

According to another aspect of the present disclosure, there is provided a system that includes a tunable filter and a control circuit. The tunable filter includes an input port, an output port and a tunable bandpass filter connected between the input port and the output port configured to provide out-of-band rejection about a tunable frequency center. The tunable filter also includes multiple fixed frequency filters, each of a different corresponding fixed frequency, connected in parallel between ground and a line connecting the tunable bandpass filter to the input port and/or the output port and configured to provide high rejection at the corresponding fixed frequency, where each of the fixed frequency filters are selectively connectable to the line connecting the tunable bandpass filter to the input port and/or the output port by a corresponding one of the switches. The control circuit is connected to the tunable filter and switches and configured to tune the bandpass filter and to selectively turn on the switches.

Optionally, in the preceding aspect, another implementation of the aspect provides that the fixed frequency filters are comprised of Lame-mode resonators.

Optionally, in any of the preceding aspects, another implementation of the aspect provides that the tunable bandpass filter includes a MEMS (Micro-Electro-Mechanical System) based capacitor.

Optionally, in any of the preceding aspect, another implementation of the aspect provides that the MEMS based capacitor, the fixed frequency filters, and the switches are all formed on a common integrated circuit.

Optionally, in any of the preceding aspect, another implementation of the aspect provides that the tunable bandpass filter further includes an inductor formed on the common integrated circuit.

Optionally, in any of the preceding aspects, another implementation of the aspect provides that the system is a wireless communication system and the input port is configured to connect to an antenna.

According to an additional aspect of the present disclosure, there is provided a wireless communication system including an antenna, one or both of a receiver circuit and a transmitter circuit, a tunable filter connected between the antenna and the one or both of the receiver circuit and the transmitter circuit, and a processor. The tunable filter includes: a tunable bandpass filter connected between the antenna and the one or both of the receiver circuit and the transmitter circuit, configured to provide out-of-band rejection about a tunable frequency center; a plurality of fixed frequency filters, each of a different corresponding fixed frequency, connected in parallel between ground and a line connecting the tunable bandpass filter to the antenna and/or the one or both of the receiver circuit and the transmitter circuit, configured to provide high rejection at the corresponding fixed frequency; and a plurality of switches whereby each of the fixed frequency filters are selectively connectable to the line connecting the tunable bandpass filter to the antenna and/or the one or both of the receiver circuit and the transmitter circuit by a corresponding one of the switches. The processor is connected to the tunable filter and switches and configured to tune the bandpass filter and to selectively turn on the switches.

Optionally, in the preceding aspect, another implementation of the aspect provides that the fixed frequency filters are comprised of Lame-mode resonators.

Optionally, in any of the preceding aspects, another implementation of the aspect provides that the tunable bandpass filter includes a MEMS (Micro-Electro-Mechanical System) based capacitor.

Optionally, in any of the preceding aspect, another implementation of the aspect provides that the MEMS based capacitor, the fixed frequency filters, and the switches are all formed on a common integrated circuit.

Optionally, in any of the preceding aspect, another implementation of the aspect provides that the tunable bandpass filter further includes an inductor formed on the common integrated circuit.

Optionally, in any of the preceding aspects, another implementation of the aspect provides that the wireless communication system is a telephone.

DETAILED DESCRIPTION

The following presents examples of tunable filter designs that can be used to replace the sort of filter banks used in mobile phones and other wireless communication system, using a tunable filter that can have smaller size and lower cost. Mobile phones and other devices are often required to support multi-bands, Multi-input, Multi-output (MIMO), and other requirements to meet rapidly developing wireless communication standards. This leads to more and more filters being used in a mobile phone to meet the performance specification. As a result, the size and cost of filters has become an issue. In the following, a tunable filter, which has a smaller size and lower cost, compared to a filter bank or numerous filters, is described.

Embodiments of the tunable filter include a tunable bandpass filter and numerous switched Lame-Mode Resonator (LMR) other resonators as notch filters. The tunable bandpass filter is to provide out-of-band rejection and the resonant frequency of the passband can be tuned, while the switched LMR notch filters are frequency-fixed to provide high rejection at desired frequency ranges. With this design, because of the high Q (~1000) of LMRs, a high rejection can be achieved even with an adjustable low Q (~200) bandpass filter.

Figure 1:
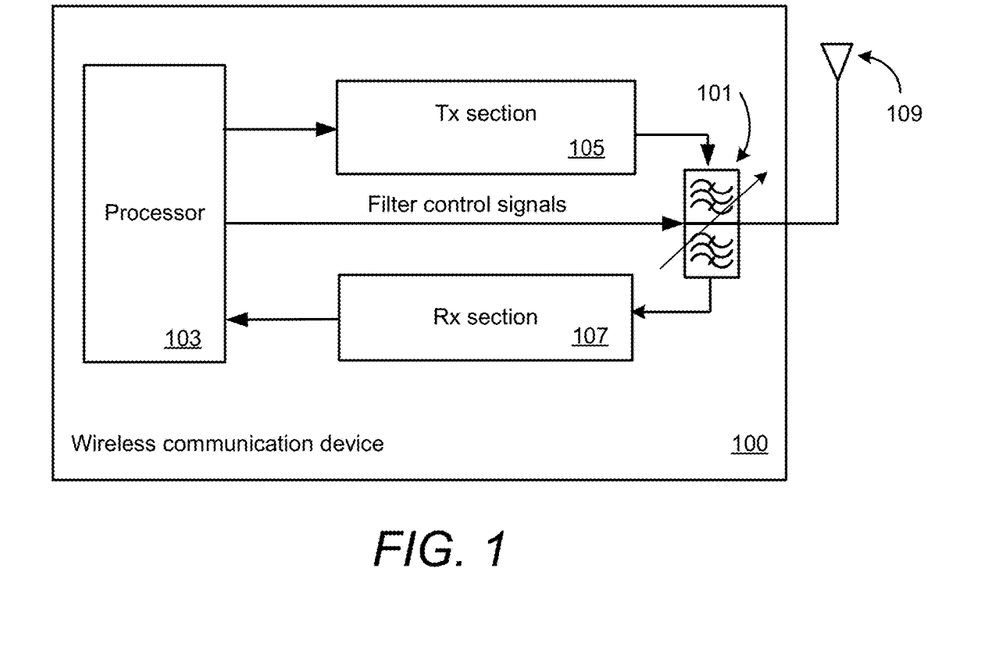
FIG. 1 is a block diagram of a wireless communication device as an example of a system into which described embodiments of tunable filters can be incorporated.

FIG. 1 is a block diagram of a wireless communication device as an example of a system into which described embodiments of tunable filters can be incorporated. In the simplified representation of FIG. 1, the cell phone or other wireless communication device 100 includes a processor section 103, a transmission Tx section 105 and a receiver Rx section 107, where both the Tx section 105 and Rx section 107 are connected to an antenna 109. The Tx section receives signals to be transmitted, up-convers these to a band in the RF range, amplifies these and provides them to the antenna 109. On the receive side, the Rx section 107 receives RF signals from antenna 109, down converts these and performs other signal processing, passing on the processed received signals to the processor block.

The signals received at, or supplied to, the antenna 109 may be from a number of different frequency bands. To remove the unwanted frequency bands, a bandpass filter 101 can be included along the path from the antenna 109 to the Rx section 107. For example, the tunable filter could be placed between an antenna switch and a low noise amplifier in the Rx section 107, between the Tx section 105, or both. FIG. 1 illustrates an example of a tunable duplexer connected between both of the Tx section 105 and Rx section 107 and the antenna 109 for the adjustable bandpass filter 101. As the wireless communication device may want to use different frequency band at different time, the filter 101 can be tunable, based on control signals from the processor 103. FIG. 1 only illustrates a tunable filter in both the receive and transmit paths, but other embodiments may alternately use such a filter in just one of the paths.

Figure 2:
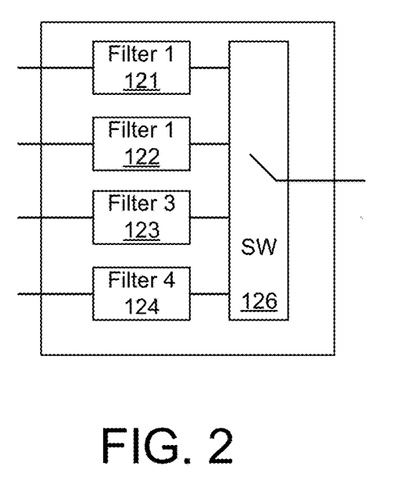
FIGS. 2 and 3 respectively illustrate a switchable bank of filters and a tunable filter.

FIGS. 2 and 3 show examples of filters as can be used for the filter 101 of FIG. 1. The example of FIG. 2 includes a bank of filters of Filter 1 121, Filter 2 122, Filter 3 123 and Filter 4 124. Each filter can pass a different frequency band and a switch SW 126 allows for the processor or other control circuitry to selective connect the filters of the bank. Although this approach can work, it requires a large number of components and consequently large amount of area, particularly as the number of bands increases.

Figure 3:
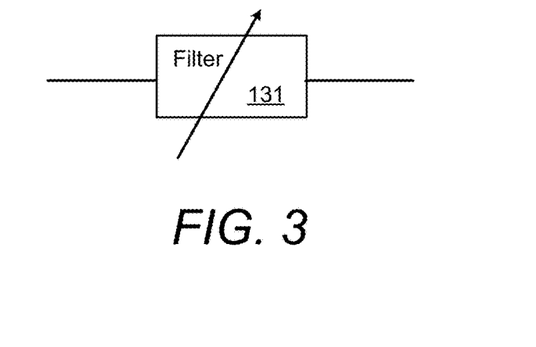

Another approach is to use an adjustable bandpass filter, such as 131 of FIG. 3, where the frequency of the center of the pass band can be adjusted. This can help to reduce the number components, but such adjustable band pass filters tend to have a limited useful adjustment range and low Q values.

To overcome these limitations, the following presents a tunable filter with a wide tuning range and high rejection that can be achieved by integrating a reconfigurable filter and numerous switched, fixed-frequency filters. A tunable bandpass filter provides out-of-band rejection. This is then combined with switched, fixed-frequency filters to provide rejection at desired frequency bands, using notch resonators that can be cascaded, whereas passband resonators cannot. Under this arrangement, deep rejection can be achieved even with low-Q bandpass filters for the adjustable filter.

Figure 4A:
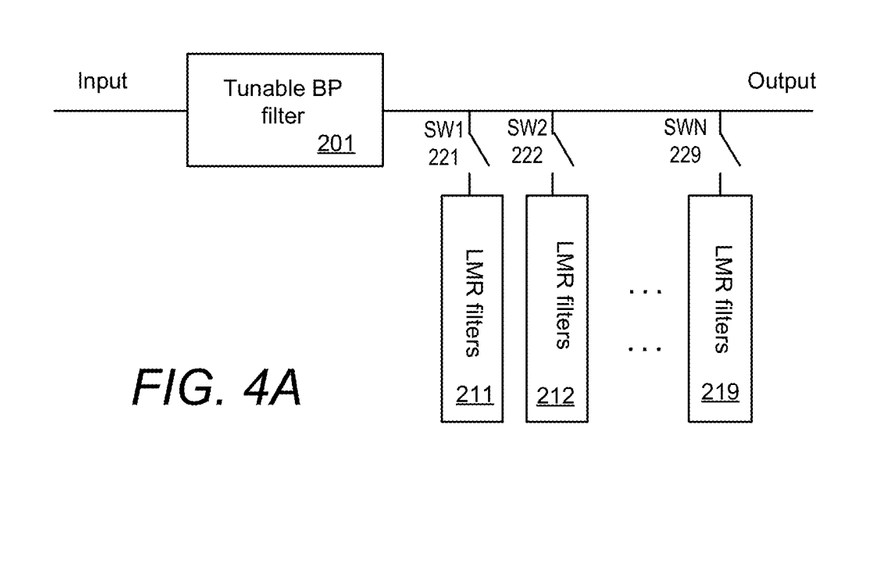
FIG. 4A illustrates an embodiment of a tunable filter including a tunable bandpass filter and a set of individually selectable cascaded notch filters.

FIG. 4A illustrates an embodiment of a tunable filter including a tunable bandpass filter and a set of individually selectable cascaded notch resonators. A tunable bandpass filter 201 is connected between an input port and an output port. For example, in some embodiments the tunable bandpass filter can be a variable capacitor in series with an inductor. A plurality of notch resonators or filters 211-219 are connected in parallel between ground and the line connecting the tunable bandpass filter 201 to the output port. For example, the output port could be connected to an antenna and the input port could be connected to a transmit or receive circuit, as illustrated in FIG. 1. Each of the resonators is connectable to the line by a corresponding switch SW1-SWN 221-229. A processor or other control circuit can be connected to the bandpass filter 201 and switches SW1-SWN 221-229 to configure the filter for the desired frequency band by selectively turning the switches SW1-SWN 221-229 on or off and by adjusting the bandpass filter 201 by, for example, setting an adjustable capacitance. The resonators can, among other embodiments, be implemented as Surface Acoustic Wave (SAW), Bulk Acoustic Wave (BAW) resonator, such as thin-film bulk acoustic resonators (FBAR or TFBAR), or, as illustrated in FIG. 4A, Lame-Mode Resonators (LMRs, also known as contour-mode resonators or CMRs).

In some embodiments, the tunable bandpass filter 201 can use a MEMS (Micro-Electro-Mechanical System) based tunable filter to provide out-of-band rejection. The MEMS filter can be composed of integrated high-Q inductors and a MEMS based switched capacitor bank. MEMS capacitors have much higher Q than semiconductor varactors, and a multi-bit MEMS cap-bank allows a wide tuning range.

In some embodiments, the filters 211-219 of FIG. 4A can be implemented as Lame-Mode Resonators (LMR, also known as contour-mode resonators or CMR) based switched fixed-frequency filters to provide rejection at desired frequency bands. LMR resonators rely on lateral mode bulk acoustic wave resonance in a thin-film substrate to achieve high-Q (as high as 2,000) resonance.

In FIG. 4A, all of the fixed frequency filters 211-219 are connected between the tunable bandpass filter 201 and the output port, but in other arrangements some or all of the fixed frequency filters 211-219 may be connected between the tunable bandpass filter 201 and the input port or interleaved with components of the tunable bandpass filter 201. Additionally, although shown in FIG. 4A as single blocks, the fixed frequency filters 211-219 and tunable bandpass filter 201 can be made up of a number of components, as illustrated in FIGS. 4B and 4C.

Figure 4B:
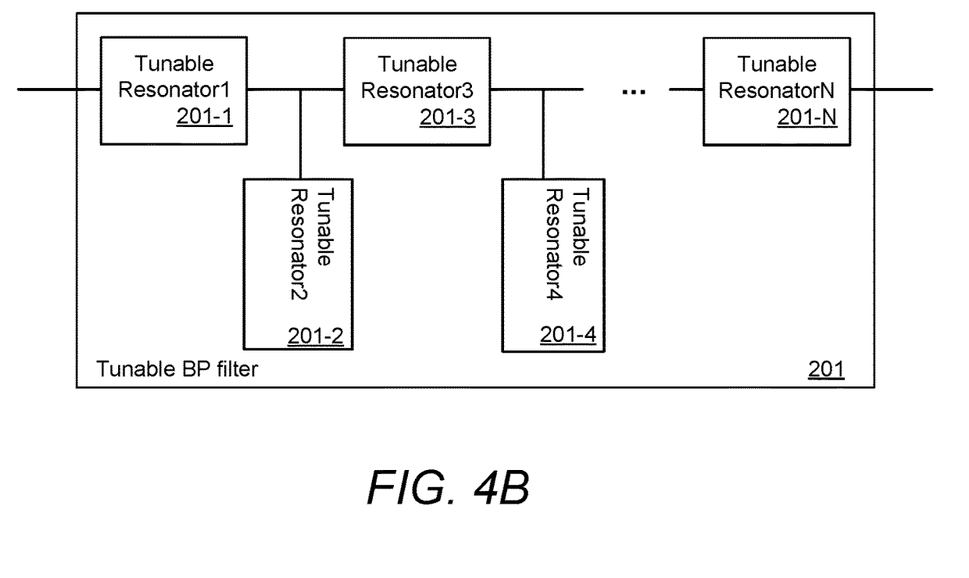
FIGS. 4B and 4C provide more detail for embodiments of the tunable bandpass filter and fixed frequency filters.
Figure 4C:
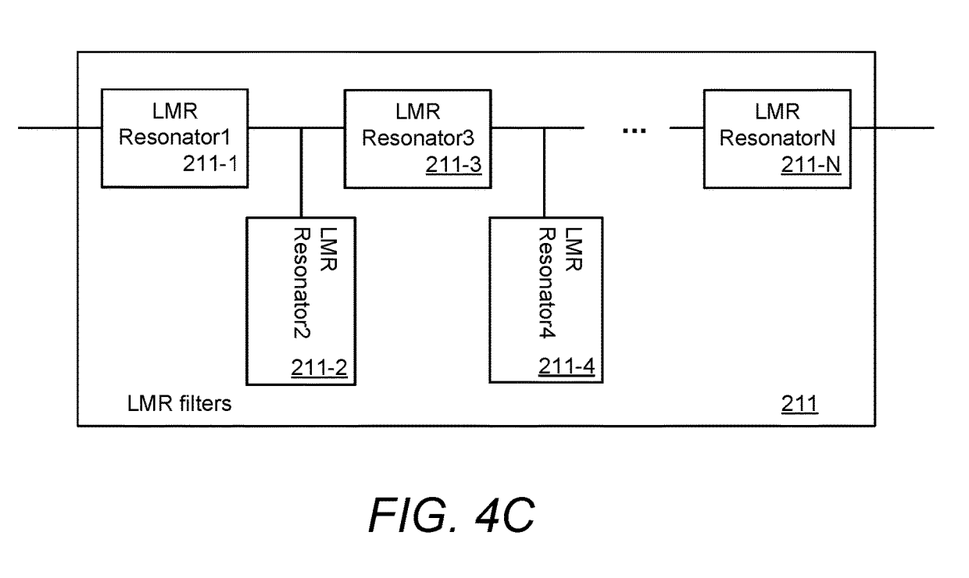

As illustrated in FIG. 4B, the tunable bandpass filter block 201 of FIG. 4A can be made up of a number of separate tunable resonators arranged in various topologies. FIG. 4B illustrates one embodiment of N tunable resonators 201-1, 201-2, . . . , 201-N. Similarly, as illustrated in FIG. 4C, the fixed frequency filter blocks 211-219 of FIG. 4A can be made up of a number of separate fixed frequency resonators arranged in various topologies. FIG. 4C illustrates one embodiment of N fixed frequency LMR resonators 211-1, 211-2, . . . , 211-N for the fixed frequency filter 211.

Figure 5:
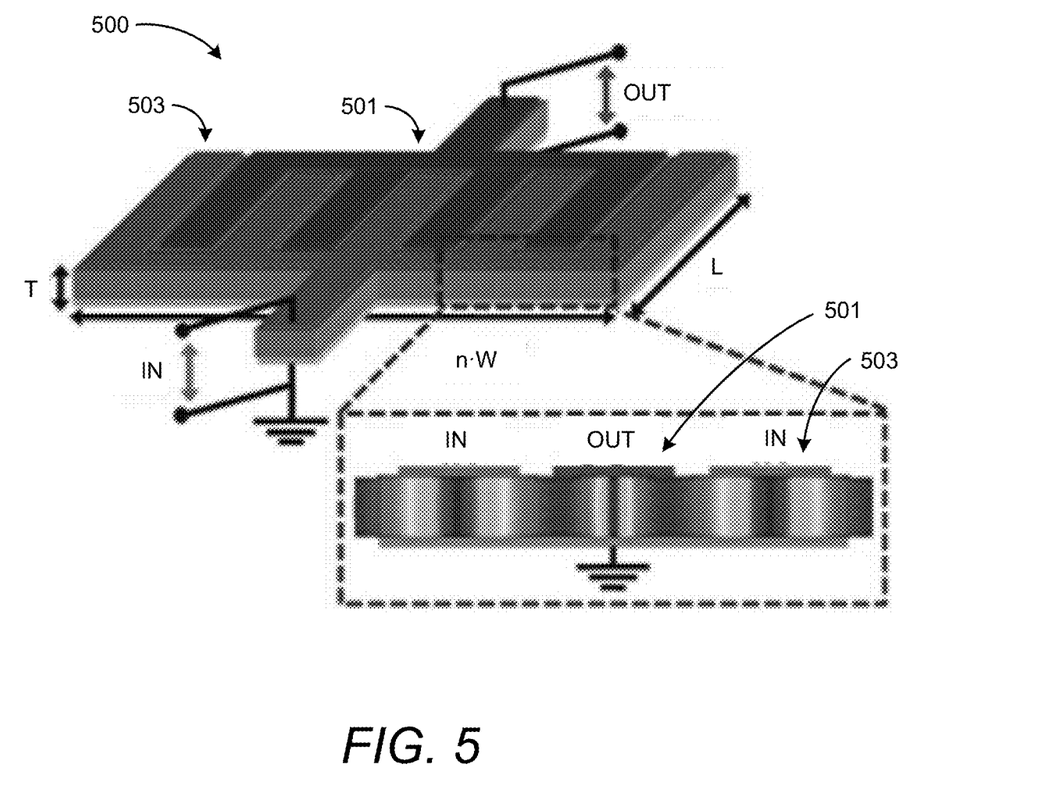
FIG. 5 is a rendering of a Lame-Mode Resonator (LMR), such as can be used in some embodiments for the high-Q notch resonators of FIG. 4A.

FIG. 5 is a rendering of a Lame-Mode Resonator (LMR) 500, such as can be used in some embodiments for high-Q notch resonator. In some embodiments, the LMR structure can be etched out of a substrate similarly to the formation of the MEMS elements and has one fork-like structure 503 for the IN side (here connected to ground) and another fork-like structure 501 connected to the OUT side (such as to output port through the switches SW1-SWN 221-229), where the tines of each fork structure are interlaced. Although FIG. 5 only shows a few tines on each side, an actual embodiment may have tens of such tines on each side in a comb-like structure. In one set of embodiments, the thickness T may be on the order of a few hundred nanometers, the length L on the order of around 10 microns, each of the tines of the comb structures a few hundred nanometers and separated by a somewhat lesser distance, where the total width nW of n tines can be on the order of tens of microns. Other embodiments can use Surface Acoustic Wave (SAW) or Bulk Acoustic Wave (BAW) resonator-based devices, such as thin-film bulk acoustic resonators (FBAR or TFBAR), rather than LMRs. However, compared to FBAR embodiments, LMRs have the advantage of allowing multiple resonators with drastically different frequencies on the same substrate because the resonant frequency is determined by lithography.

Figure 6A:
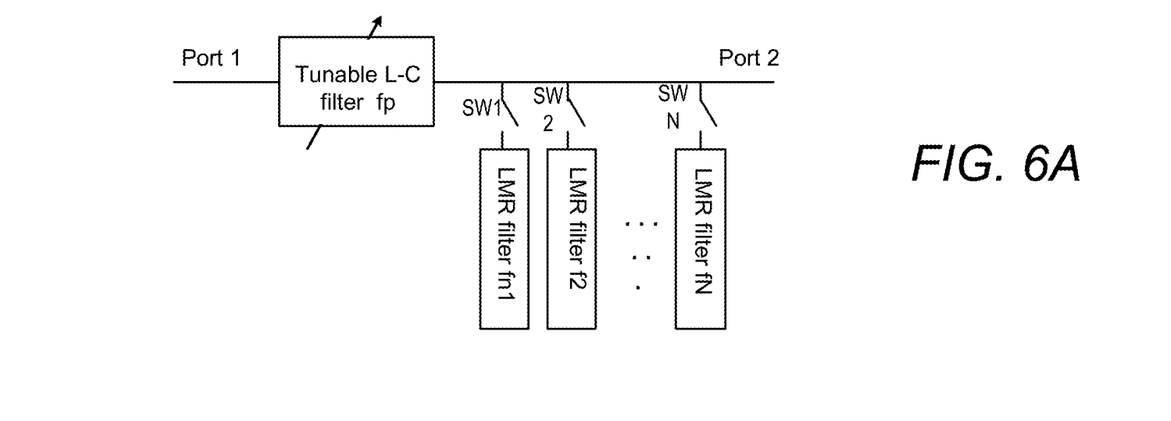
FIGS. 6A-6D illustrate examples of tuning the filter of FIG. 4A.
Figure 6B:
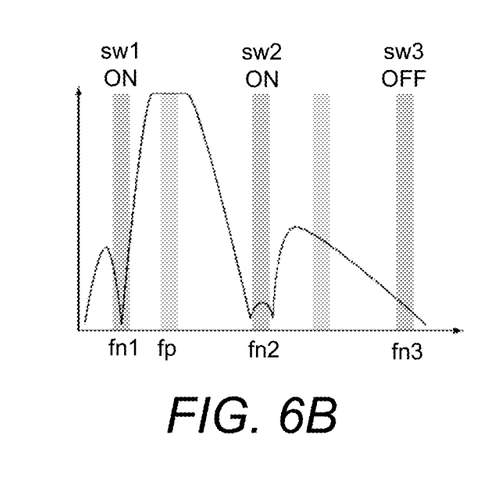
Figure 6C:
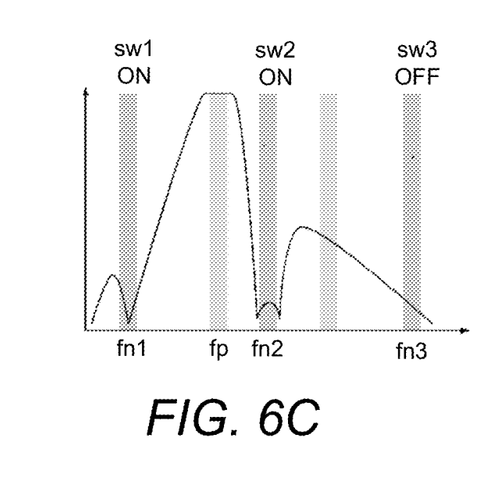
Figure 6D:
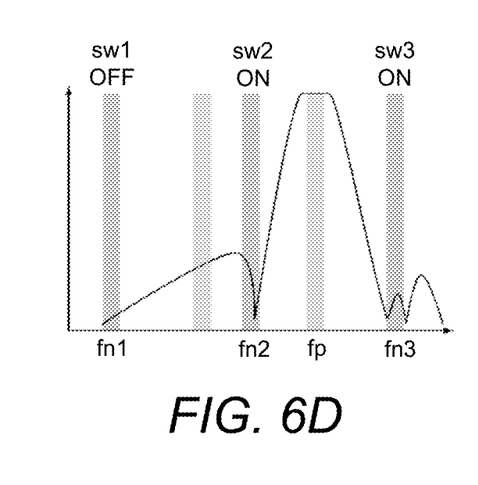

FIGS. 6A-6D illustrate examples of tuning the filter of FIG. 4A. For reference, FIG. 6A reproduces an example of the filter of FIG. 4A. To select a particular band, the tunable L-C filter is configured to center the passband in the desired range and then one or more of the LMR notch resonators are connected to achieve deep rejection even with low-Q bandpass resonators. FIGS. 6B-6D give several examples.

In FIG. 6B-6D, the darker bands at frequency ranges centered at fn1, fn2, and fn3 correspond to a set of three fixed frequency notch LMR resonators that can be selectively connected to the line between Port 2 and the tunable passband filter. The lighter bands correspond to frequency fp of the tunable passband filter. In FIG. 6B, the selected passband frequency is between the notch bands of fn1 and fn2, where switches sw1 and sw2 are on and sw3 is off. The trace corresponds to the filter response when configured this way. As can be seen, the response of the passband filter by itself is pulled down by the resonators at fn1 and fn2 to provide the resultant filter response shown by the trace. FIG. 6C is similar to FIG. 6B, but where the tunable bandpass filter has been reconfigured to move its frequency center to a higher frequency, but still between fn1 and fn2. As in FIG. 6B, the response drops sharply at the nearby frequencies of the notch resonators.

In FIG. 6D, the bandpass filter is configured so that the selected passband center fp is now between frequencies fn2 and fn3 of the corresponding LMR resonators. The switches sw2 and sw3 are on, and sw1 is off. The response trace shows how the low Q response of the bandpass filter is pulled down at fn2 and fn3 to provide the desired narrow response.

Figure 7:
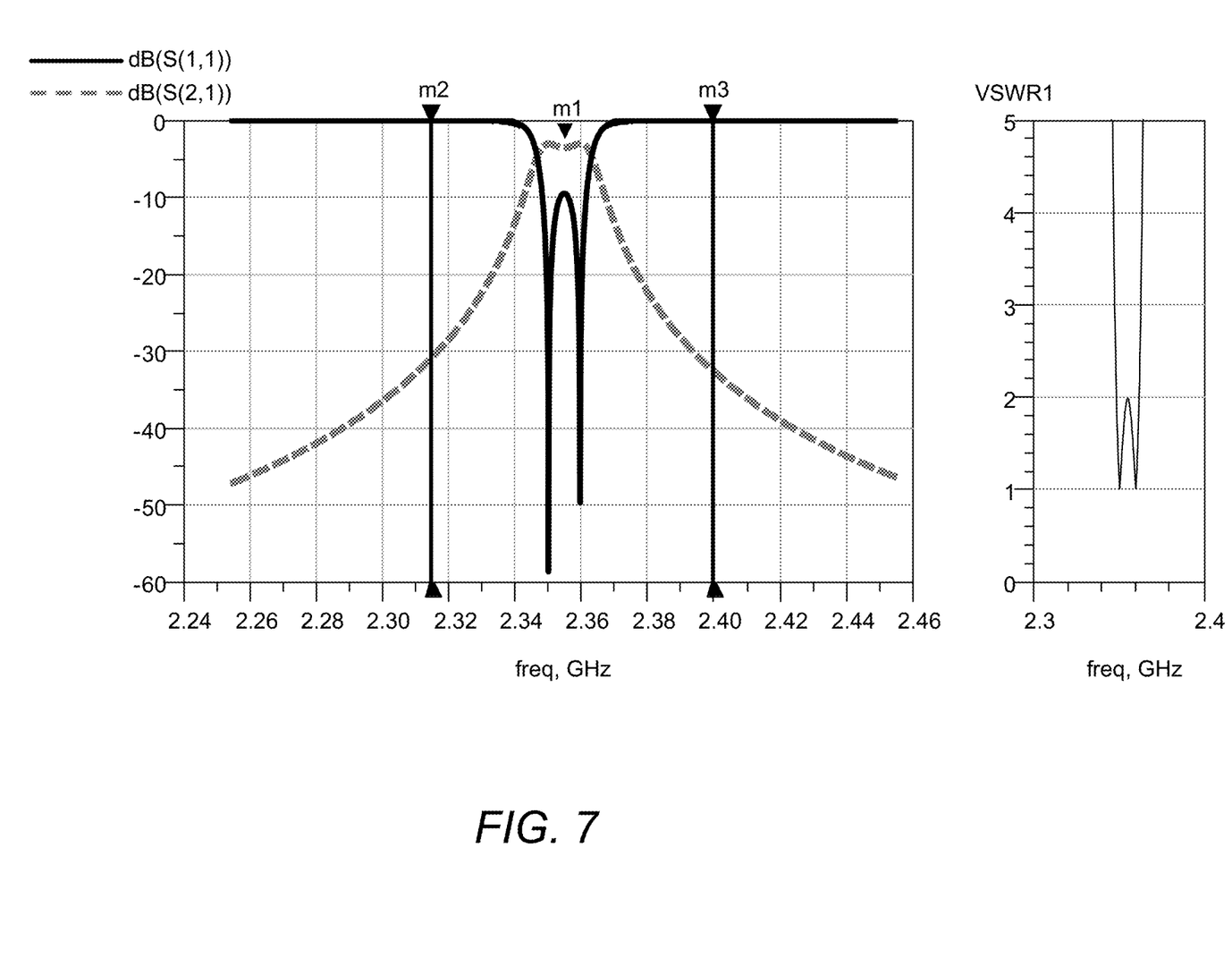
FIGS. 7 and 8 respectively illustrate the response of tunable, bandpass filter of FIG. 4A alone and for the filter of FIG. 4A when the cascaded notch filters are included.
Figure 8:
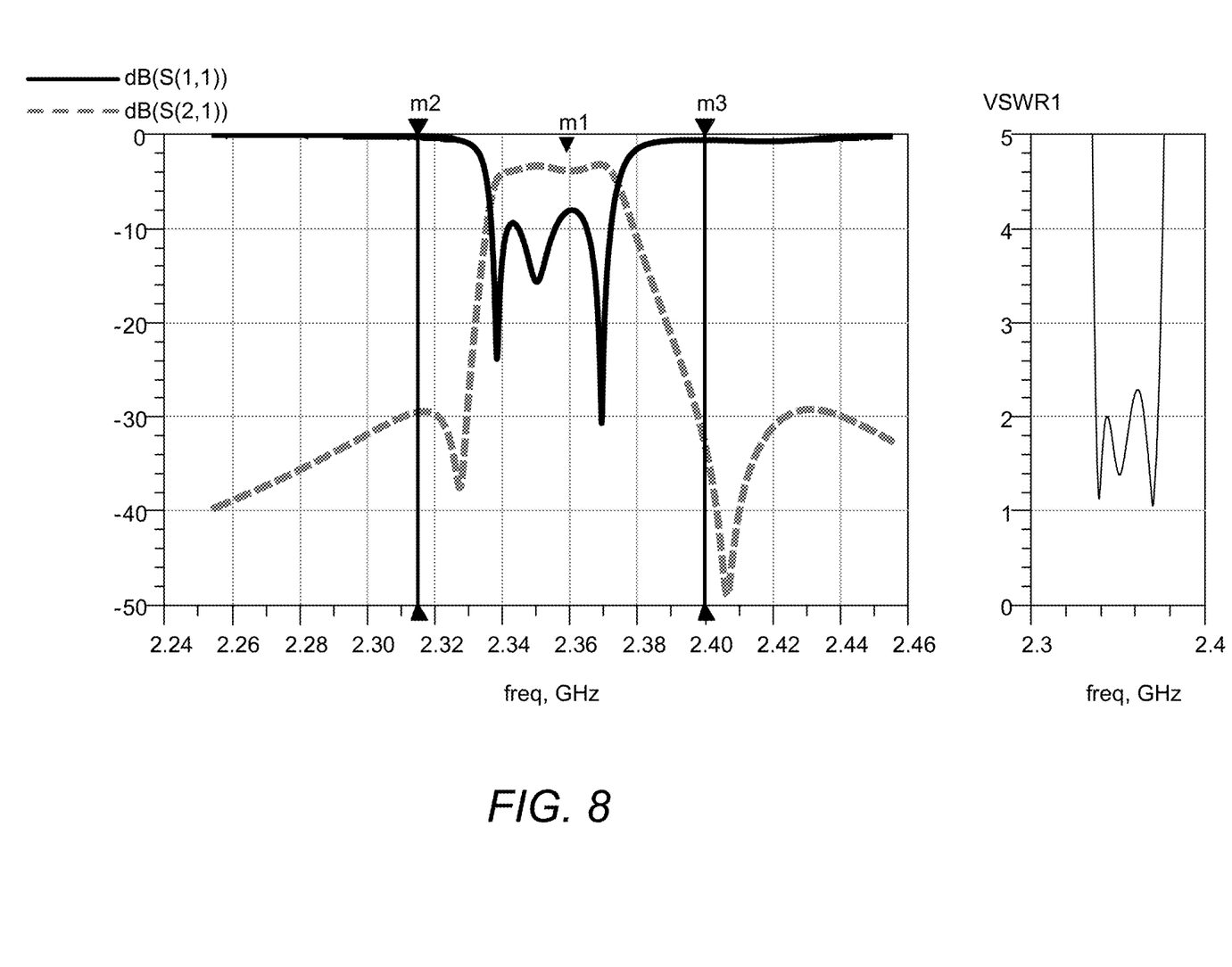

FIGS. 7 and 8 respectively illustrate examples of the response of for one embodiment of a tunable bandpass filter of FIG. 4A alone and for the filter of FIG. 4A when the cascaded notch resonators are included. In FIGS. 7 and 8, m1 corresponds to the center frequency of the tunable bandpass filter section and m2 and m3 correspond to notch resonators with fixed frequencies on either side of the center frequency at m1. In both of FIGS. 7 and 8, the solid line corresponds to the amplitude in decibels of the scattering reflection matrix element S(1,1) and the broken line corresponds to the amplitude in decibels of the scattering transmission matrix element S(2,1). To the right in both of FIGS. 7 and 8 is the amplitude of VSWR1, the voltage ratio between the transmitted and reflected waves.

More specifically, FIGS. 7 and 8 consider an example using the B30 band, where the center frequency of m1 is around 2.355 GHz and the frequencies m2 and m3 are respectively around 2.315 GHz and 2.4 GHz, at which an attenuation on the order of −30 dB is wanted. FIG. 7 illustrates the case for just the bandpass filter. To meet the specification, the bandpass filter needs to have an unloaded Q factor, Qu, of 550.

FIG. 8 illustrates the case for two LMR resonators (Q~1300) at the fixed frequencies of m2 and m3 in addition to the adjustable bandpass filter centered at m1. Under this arrangement, the Qu requirement on the bandpass filter can be relaxed to 225 without impacting out of band rejection since the fixed frequency filters centered at m2 and m3 greatly pull down the transmission around these two frequencies, as illustrated by the dips in the scattering transmission matrix element S(2,1) curve.

Figure 9:
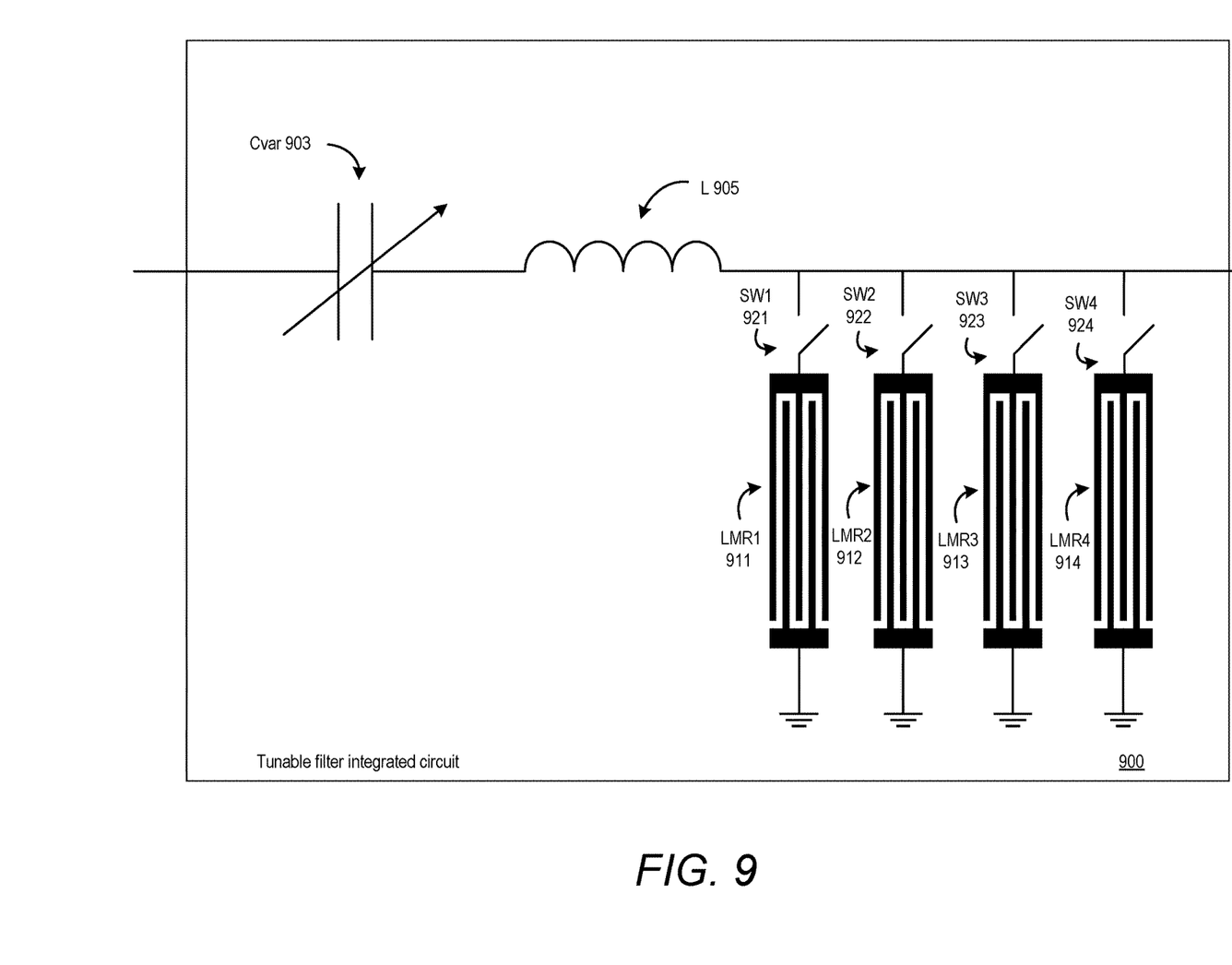
FIG. 9 shows an embodiment of the tunable filter formed an integrated circuit.

FIG. 9 illustrates an embodiment the filter elements are formed as a tunable filter integrated circuit 900. The example includes four LMR resonators LMR1-LMR4 911-914 for the fixed frequency filters, each selectively connectable to the line from the adjustable bandpass filter to the output port by a corresponding switch SW1-SW4 921-924. The tunable bandpass filter is formed of a variable capacitance Cvar 903 and an inductor L 905 connected in series and can use a MEMS (Micro-Electro-Mechanical System) based implementation to provide out-of-band rejection. The MEMS filter can be composed of integrated high-Q inductors for L 905 and a MEMS based switched capacitor bank that allows a wide tuning range Cvar 903. Compared to the filter structures illustrated in FIGS. 2 and 3, the arrangement of FIG. 9 saves on area and switch loss with all of elements formed on a single chip. In other embodiments, the inductor L 905 may be a separate element or elements not formed on the integrated circuit 900, but this can still provide a savings of area and reduction of switch loss.

Figure 10:
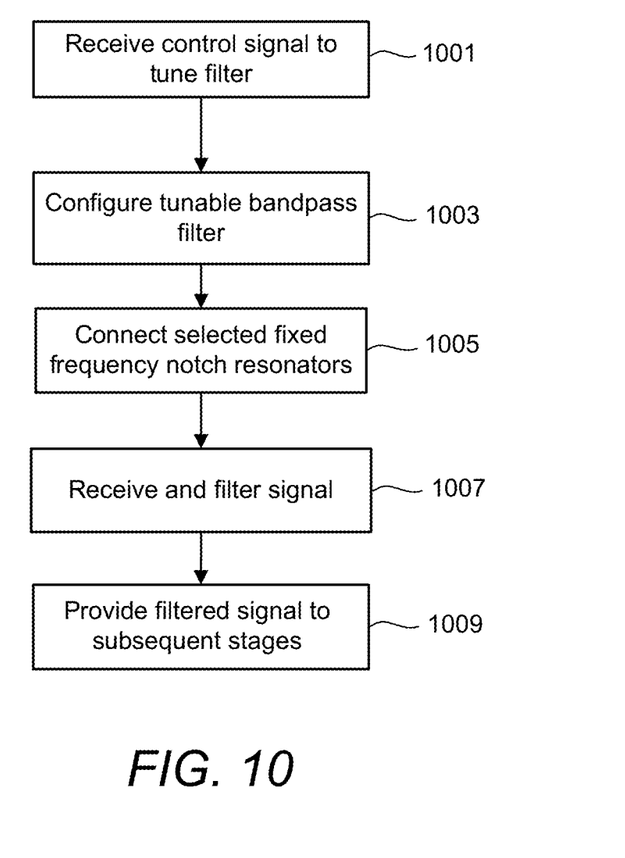
FIG. 10 is a flow illustrating the operation of the filter of FIG. 4A or 9.

FIG. 10 is a flow illustrating the operation of a tunable filter such as that of FIG. 4A or 9, beginning at 1001 with receiving the control signals for tuning the filter, where, for example, this can be based on control signals from the processor of a mobile phone or other wireless communication device. At 1003 the tunable, low Q broadband filter is configured to center its passband around the desired band. For example, in the embodiment of FIG. 9, the capacitance of Cvar 903 is set to the frequency center at the wanted frequency. At 1005, the filter is further configured by connecting the selected fixed frequency notch resonators, such as by turning selectively turning on the switches SW1-SWN 921-929 to connect the chosen ones of filters 911-919 in FIG. 9. Once the filter is configured, the system can receive and filter signals, at 1007, and provide the filter signals on to any subsequent stages of the system. Consequently, the tunable filter with wide tuning range and high out-of-band rejection is achieved with a tunable bandpass filter and numerous LMR notch filters.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
 an input port;
 an output port;
 a tunable bandpass filter having a broad pass band connected between the input port and the output port the tunable bandpass filter configured to provide out-of-band rejection about a tunable frequency center having a wide tuning range;
 a plurality of fixed frequency notch resonator filters each of a different corresponding fixed frequency center connected in parallel between a ground and a line connecting the tunable bandpass filter to the input port and/or the output port and configured to provide high rejection at the corresponding fixed frequency center, the fixed frequency centers configured such that when the frequency center of the tunable bandpass filter is between the frequency centers of a pair of the plurality of fixed frequency notch resonator filters having adjacent frequency centers, the frequency center of the pair of the plurality of fixed frequency notch resonator filters will be within the pass band of the tunable bandpass filter;
 a plurality of switches whereby each of a corresponding one of the plurality of fixed frequency filters are selectively connectable to the line connecting the tunable bandpass filter to the input port and/or the output port by a corresponding one of the switches; and
 a control circuit connected to the tunable bandpass filter and the switches and configured to:
  tune the frequency center of the tunable bandpass filter to be between the corresponding frequency centers of a first pair of the plurality of fixed frequency notch resonator filters having adjacent frequency centers; and
  with the frequency center of the tunable bandpass filter tuned to be between the corresponding frequency centers of the first pair of the fixed frequency notch resonator filters, selectively turn on the switches corresponding to the first pair of the fixed frequency notch resonator filters.

2. The apparatus of claim 1, wherein the plurality of fixed frequency filters comprise Lame-mode resonators.

3. The apparatus of claim 1, wherein the plurality of fixed frequency filters comprise thin film bulk acoustic resonators.

4. The apparatus of claim 1, wherein the plurality of fixed frequency filters comprise surface acoustic wave resonators.

5. The apparatus of claim 1, wherein the tunable bandpass filter comprises a MEMS (Micro-Electro-Mechanical System) based capacitor.

6. The apparatus of claim 5, wherein the MEMS based capacitor, the plurality of fixed frequency filters, and the switches are all formed on a common integrated circuit.

7. The apparatus of claim 6, wherein the tunable bandpass filter further comprises an inductor formed on the common integrated circuit.

8. The apparatus of claim 6, wherein the tunable bandpass filter further comprises an inductor not formed on the common integrated circuit.

9. The apparatus of claim 1, wherein the control circuit is further configured to:
subsequent to tuning the tunable bandpass filter to be between the corresponding frequency centers of the first pair of the fixed frequency notch resonator filters, tune the frequency center of the bandpass filter to be between the corresponding frequency centers of a second pair of the plurality of fixed frequency notch resonator filters having adjacent frequency centers; and
with the frequency center of the tunable bandpass filter tuned to be between the corresponding frequency centers of the second pair of the fixed frequency notch resonator filters, selectively turn on the second pair of the fixed frequency notch resonator filters.

10. The apparatus of claim 1, wherein the apparatus is a wireless communication system and the input port is configured to connect to an antenna.

11. A wireless communication system, comprising:
an antenna;
one or both of a receiver circuit and a transmitter circuit;
a tunable filter connected between the antenna and the one or both of the receiver circuit and the transmitter circuit, comprising:
a tunable bandpass filter having a broad pass band connected between the antenna and the one or both of the receiver circuit and the transmitter circuit, the tunable bandpass filter configured to provide out-of-band rejection about a tunable frequency center having a wide tuning range;
a plurality of fixed frequency notch resonator filters, each of a different corresponding fixed frequency center, connected in parallel between a ground and a line connecting the tunable bandpass filter to the antenna and/or the one or both of the receiver circuit and the transmitter circuit, configured to provide high rejection at the corresponding fixed frequency center, the fixed frequency centers configured such that when the frequency center of the tunable bandpass filter is between the frequency centers of a pair of the plurality of fixed frequency notch resonator filters having adjacent frequency centers, the frequency center of the pair of the plurality of fixed frequency notch resonator filters will be within the pass band of the tunable bandpass filter;
a plurality of switches whereby each of a corresponding one of the plurality of fixed frequency filters are selectively connectable to the line connecting the tunable bandpass filter to the antenna and/or the one or both of the receiver circuit and the transmitter circuit by a corresponding one of the switches; and
a processor connected to the tunable filter and switches and configured to:
tune the frequency center of the tunable bandpass filter to be between the corresponding frequency centers of a first pair of the plurality of fixed frequency notch resonator filters having adjacent frequency centers; and
with the frequency center of the tunable bandpass filter tuned to be between the corresponding frequency centers of the first pair of the fixed frequency notch resonator filters, selectively turn on the switches corresponding to the first pair of the fixed frequency notch resonator filters.

12. The wireless communication system of claim 11, wherein the plurality of fixed frequency filters comprise Lame-mode resonators.

13. The wireless communication system of claim 11, wherein the tunable bandpass filter includes a MEMS (Micro-Electro-Mechanical System) based capacitor.

14. The wireless communication system of claim 13, wherein the MEMS based capacitor, the plurality of fixed frequency filters, and the switches are all formed on a common integrated circuit.

15. The wireless communication system of claim 14, wherein the tunable bandpass filter further includes an inductor formed on the common integrated circuit.

16. The wireless communication system of claim 11, wherein the wireless communication system is a telephone.

17. An apparatus, comprising:
an input port;
an output port;
means, connected between the input port and the output port, for providing out-of-band rejection about a tunable frequency center having a wide tuning range and having a broad pass band;
means, connected between a ground and a line connecting the means for providing out-of-band rejection to the input port and/or the output port, for providing high rejection at a selected one or more of a plurality of fixed frequency centers, the fixed frequency centers configured such that, when the frequency center of the means for providing out-of-band rejection is between the frequency centers of an adjacent pair of the plurality of fixed frequency centers of the means for providing high rejection at the selected one or more of the, the frequency center of the adjacent pair of the plurality of fixed frequency centers will be within the pass band of the means for providing out-of-band rejection about a tunable frequency center;
means for selecting the one or more of a plurality of fixed frequency centers for providing high rejection; and
a control circuit configured to:
tune the frequency center of the means for providing out-of-band rejection about a tunable frequency center to be between a first pair of the plurality of fixed frequency centers having adjacent frequency centers; and
with the frequency center of the means for providing out-of-band rejection about a tunable frequency center tuned to be between the first pair of fixed frequency centers having adjacent frequency centers, select the first pair of fixed frequency centers to provide high rejection.

18. The apparatus of claim 17, wherein the means for providing out-of-band rejection comprises a MEMS (Micro-Electro-Mechanical System) based capacitor.

19. The apparatus of claim 18, wherein the MEMS based capacitor, the means for providing high rejection at a selected one or more of a plurality of fixed frequencies, and the means for selectively connecting each of the fixed frequency filters to the line connecting the means for providing out-of-band rejection to the input port and/or the output port are all formed on a common integrated circuit.

20. The apparatus of claim 19, wherein the means for providing out-of-band rejection further comprises an inductor formed on the common integrated circuit.

21. The apparatus of claim 19, wherein the means for providing out-of-band rejection further comprises an inductor not formed on the common integrated circuit.

22. The apparatus of claim 17, wherein the means for providing high rejection at the selected one or more fixed frequencies comprises:
   a plurality of fixed frequency filters of different fixed frequencies connected in parallel between the ground and the line connecting the means for providing out-of-band rejection to the input port and/or the output port and configured to provide high rejection at the corresponding fixed frequencies.

23. The apparatus of claim 22, wherein the plurality of fixed frequency filters comprise Lame-mode resonators.

* * * * *

UNITED STATES PATENT AND TRADEMARK OFFICE
CERTIFICATE OF CORRECTION

| | |
|---|---|
| PATENT NO. | : 11,923,830 B2 |
| APPLICATION NO. | : 17/016846 |
| DATED | : March 5, 2024 |
| INVENTOR(S) | : Liu et al. |

It is certified that error appears in the above-identified patent and that said Letters Patent is hereby corrected as shown below:

On the Title Page

Page 2, Column 1, Item (56) Foreign Patent Documents, Line 1: please replace "IN" with -- CN --.

In the Claims

Column 10, Lines 36-37, (Claim 17): After "of" and before "the" delete "the,".

Signed and Sealed this
Ninth Day of April, 2024

Katherine Kelly Vidal
*Director of the United States Patent and Trademark Office*